US012710470B2

(12) United States Patent
Choi et al.

(10) Patent No.: US 12,710,470 B2
(45) Date of Patent: Aug. 18, 2026

(54) APPARATUS FOR TESTING SEMICONDUCTOR DEVICE TEST

(71) Applicants: Thermal Solution Technology Co., Ltd., Tokyo (JP); Byeong-gyu Choi, Seoul (KR)

(72) Inventors: Byeong-gyu Choi, Seoul (KR); Shunichi Muto, Seoul (KR)

(73) Assignees: Thermal Solution Technology Co., Ltd., Tokyo (JP); Byeong-gyu Choi, Seoul (KR)

( * ) Notice: Subject to any disclaimer, the term of this patent is extended or adjusted under 35 U.S.C. 154(b) by 150 days.

(21) Appl. No.: 18/839,154

(22) PCT Filed: Feb. 17, 2023

(86) PCT No.: PCT/KR2023/002357

§ 371 (c)(1),
(2) Date: Aug. 16, 2024

(87) PCT Pub. No.: WO2023/158270

PCT Pub. Date: Aug. 24, 2023

(65) Prior Publication Data

US 2025/0155495 A1 May 15, 2025

(30) Foreign Application Priority Data

Feb. 17, 2022 (KR) ........................ 10-2022-0020689

(51) Int. Cl.
*G01R 31/28* (2006.01)
*G01K 1/14* (2021.01)
*G01K 3/00* (2006.01)

(52) U.S. Cl.
CPC ........... *G01R 31/2875* (2013.01); *G01K 1/14* (2013.01); *G01K 3/005* (2013.01); *G01R 31/2877* (2013.01)

(58) Field of Classification Search
USPC ....................................................... 324/750.1
See application file for complete search history.

(56) References Cited

U.S. PATENT DOCUMENTS

2014/0140373 A1* 5/2014 Seo ........................ G01K 1/026 374/178
2014/0264339 A1 9/2014 Kim et al.
2021/0217945 A1 7/2021 Shimizu et al.

FOREIGN PATENT DOCUMENTS

JP 10-079532 A 3/1998
JP 2005-101544 A 4/2005

(Continued)

OTHER PUBLICATIONS

International Search Report for PCT/KR2023/002357 dated May 30, 2023 (PCT/ISA/210).

(Continued)

*Primary Examiner* — Farhana A Hoque
(74) *Attorney, Agent, or Firm* — Sughrue Mion, PLLC

(57) ABSTRACT

An apparatus for testing semiconductor device according to one embodiment comprises: a thermoelement module having both-side surfaces converted into heating surfaces or cooling surfaces according to the direction of a current; a cooling module, which is arranged on the thermoelement module and cools a thermoelement; a pusher module which is arranged under the thermoelement module, and which comes in contact with a device to be tested, mounted in a holder, so as to heat or cool the device to be tested; and a control module for controlling the direction of a current supplied to the thermoelement module according to a target temperature value.

7 Claims, 8 Drawing Sheets

(56) References Cited

FOREIGN PATENT DOCUMENTS

| | | | |
|---|---|---|---|
| JP | 2008128833 | A | 6/2008 |
| JP | 2019-204809 | A | 11/2019 |
| KR | 10-2008-0070996 | A | 8/2008 |
| KR | 10-2008-0085622 | A | 9/2008 |
| KR | 10-2008-0096068 | A | 10/2008 |
| KR | 10-1344348 | B1 | 12/2013 |
| KR | 10-2017-0000764 | A | 1/2017 |
| KR | 10-2036673 | B1 | 10/2019 |
| KR | 10-2436204 | B1 | 8/2022 |
| WO | 2020071036 | A1 | 4/2020 |

OTHER PUBLICATIONS

Communication dated Sep. 16, 2025 issued by the Japanese Patent Office in application No. 2024-549242.

* cited by examiner

APPARATUS FOR TESTING SEMICONDUCTOR DEVICE TEST

CROSS REFERENCE TO RELATED APPLICATIONS

This application is a National Stage of International Application No. PCT/KR2023/002357 filed Feb. 17, 2023, claiming priority based on Korean Patent Application No. 10-2022-0020689 filed Feb. 17, 2022.

FIELD

The present disclosure relates to an apparatus for testing semiconductor device.

DESCRIPTION OF RELATED ART

A semiconductor device should be able to maintain electrical characteristics even in a low temperature environment or a high temperature environment. Therefore, in a manufacturing process of the semiconductor device, the electrical characteristics of the semiconductor device are tested in the low-temperature or high-temperature environment. An example of a testing apparatus for a cold temperature test of the semiconductor device is disclosed in Korean Patent Application Publication No. 2003-0028070.

A testing apparatus for testing a semiconductor device may include a thermoelectric element. A pusher installed on a lower end of the thermoelectric element is in direct contact with an upper end of the semiconductor device, and a temperature of the pusher may be adjusted by controlling operation of the thermoelectric element.

A representative example of the thermoelectric element used in the apparatus for testing semiconductor device is a Peltier element. When a current is supplied to the Peltier element, heat is absorbed by one side of the Peltier element and heat is emitted from the other side thereof. The heat is applied to the semiconductor device or the semiconductor device is cooled down using the characteristics of the Peltier element, and then, a test on the electrical characteristics of the semiconductor device may be performed.

In the manufacturing process of the semiconductor device, the above-described test process is essential. Therefore, when a test on many semiconductor devices is performed at a time, a manufacturing speed of the semiconductor device may be improved, and a manufacturing cost may be reduced. Therefore, in order to increase a test speed of the semiconductor device by installing a larger number of testing apparatuses in the same space, a size of the apparatus for testing semiconductor device needs to be reduced.

In this regard, when a current is supplied to the Peltier element during a test process of the semiconductor device, a surface and an internal temperature of the Peltier element increase. Therefore, the Peltier element is made of a heat-resistant material. However, when the temperature of the Peltier element increases too high in the test process and thus exceeds an allowed temperature range, the Peltier element may be damaged. Therefore, a new pusher element capable of preventing the temperature of the Peltier element from deviating from the allowable temperature range during the operation of the testing apparatus for testing the semiconductor device is required.

DISCLOSURE

Technical Purpose

A purpose of the present specification is to provide an apparatus for testing semiconductor device having a reduced size.

Another purpose of the present disclosure is to provide an apparatus for testing semiconductor device capable of preventing a temperature of a Peltier element from deviating from an allowable temperature range during a semiconductor device test process.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

Technical Solution

An apparatus for testing semiconductor device according to one embodiment includes: a thermoelectric element module having both opposing surfaces switched to a heating surface or a cooling surface according to a flow direction of current flowing in the thermoelectric element module; a cooling module disposed on top of the thermoelectric element module and configured to cool the thermoelectric element; a pusher module disposed under the thermoelectric element module and contacting a test target device mounted on a holder to heat or cool the test target device; and a control module configured to control the flow direction of the current to be supplied to the thermoelectric element module based on a target temperature value.

In one embodiment, the thermoelectric element module includes: an upper substrate in contact with the cooling module; a lower substrate in contact with the pusher module; an intermediate substrate disposed between the upper substrate and the lower substrate; a plurality of first semiconductor elements and a plurality of second semiconductor elements disposed between the upper substrate and the intermediate substrate; and a plurality of third semiconductor elements and a plurality of fourth semiconductor elements disposed between the intermediate substrate and the lower substrate.

In one embodiment, a temperature sensor is disposed at one side of the intermediate substrate or inside the intermediate substrate.

In one embodiment, the control module is configured to control the flow direction of the current to be supplied to the thermoelectric element module, based on a temperature value of the intermediate substrate measured by the temperature sensor.

In one embodiment, the control module is configured to: in increasing a temperature of the lower substrate to a preset final target temperature value, control the flow direction of the current to be supplied to the thermoelectric element module, based on a temperature value of the intermediate substrate, a preset intermediate rising target temperature value, and a preset intermediate falling target temperature value.

In one embodiment, the control module is configured to: when the temperature value of the intermediate substrate exceeds a predetermined reference temperature value in increasing the temperature of the lower substrate according to the intermediate rising target temperature value, control the flow direction of the current to be supplied to the thermoelectric element module such that the temperature of the lower substrate is decreased based on the intermediate falling target temperature value.

In one embodiment, the intermediate rising target temperature value includes a plurality of values set to gradually increase by a predetermined increment.

In one embodiment, the reference temperature value is set to be lower than a limit temperature value of the intermediate substrate.

In one embodiment, each of the first semiconductor element, the second semiconductor element, the third semiconductor element, and the fourth semiconductor element has a hexahedral shape, and has an upper surface and a lower surface having a square shape.

In one embodiment, a numerical ratio (W:H) of a length W of each of four sides of the upper surface or the lower surface of each of the first semiconductor element, the second semiconductor element, the third semiconductor element, the fourth semiconductor element and a height H of each of the first semiconductor element, the second semiconductor element, the third semiconductor element, and the fourth semiconductor element is set to be within a range of 1:1 to 1:1.4

Technical Effect

According to embodiments, a size of the apparatus for testing semiconductor device may be reduced. Therefore, a large number of apparatus for testing semiconductor devices may be disposed in the same space, such that a manufacturing speed of the semiconductor device may be improved, and manufacturing cost thereof may be reduced.

According to embodiments, the temperature of the Peltier element does not deviate from the allowable temperature range during the operation of the testing apparatus. Therefore, the apparatus may test the semiconductor device in a more stable manner.

DETAILED DESCRIPTIONS

Figure 1:
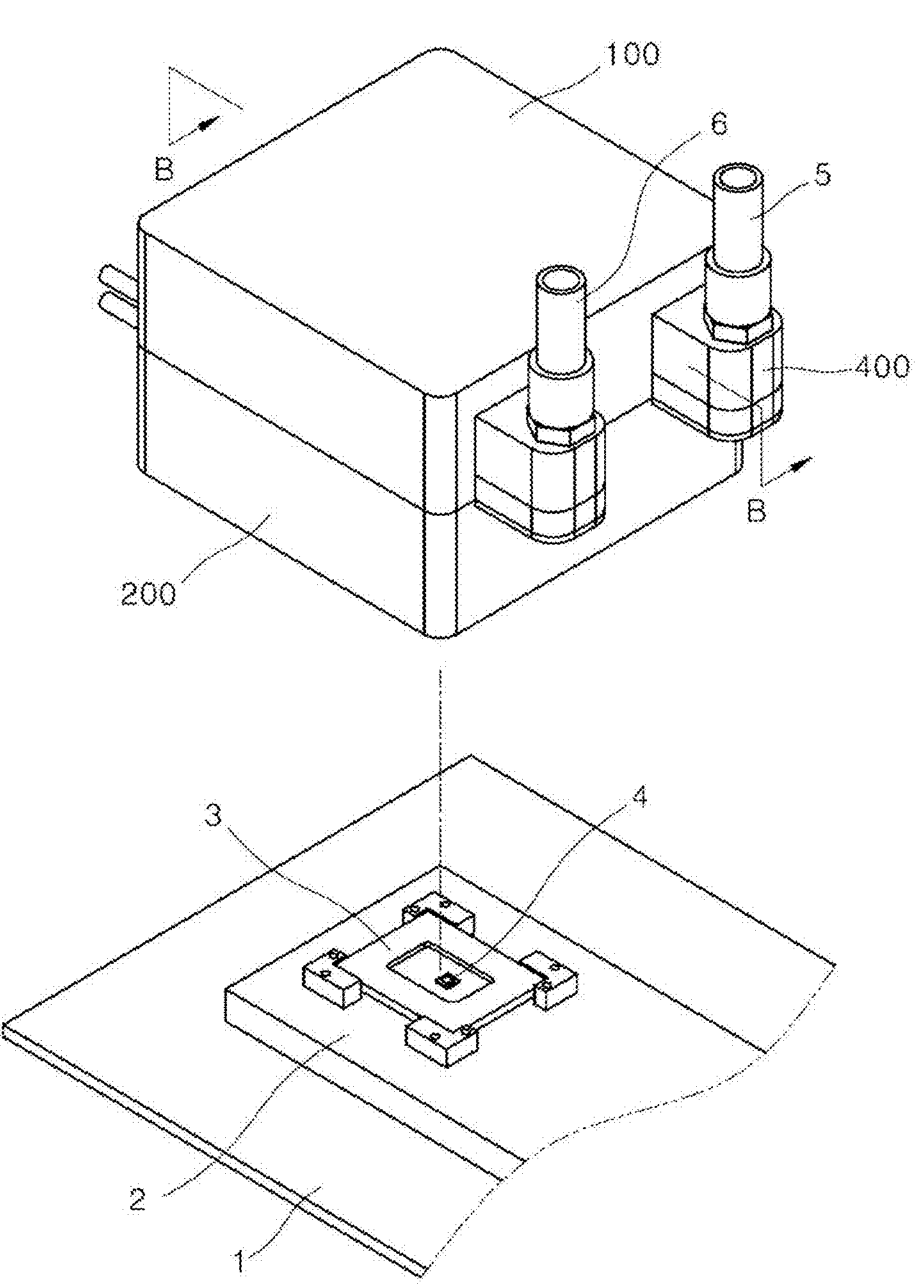
FIG. 1 is a perspective view of an apparatus for testing semiconductor device according to an embodiment.

The foregoing purposes, features, and advantages will be described in detail with reference to the accompanying drawings, and thus, those skilled in the art to which the present disclosure pertains may easily implement the embodiments of the present disclosure. In the following descriptions of the present disclosure, a detailed description of known functions and configurations incorporated herein will be omitted when it may make the subject matter of the present disclosure rather unclear. Hereinafter, preferred embodiments of the present disclosure will be described in detail with reference to the accompanying drawings. Like reference numerals in the drawings denote the same or similar elements.

Figure 2:
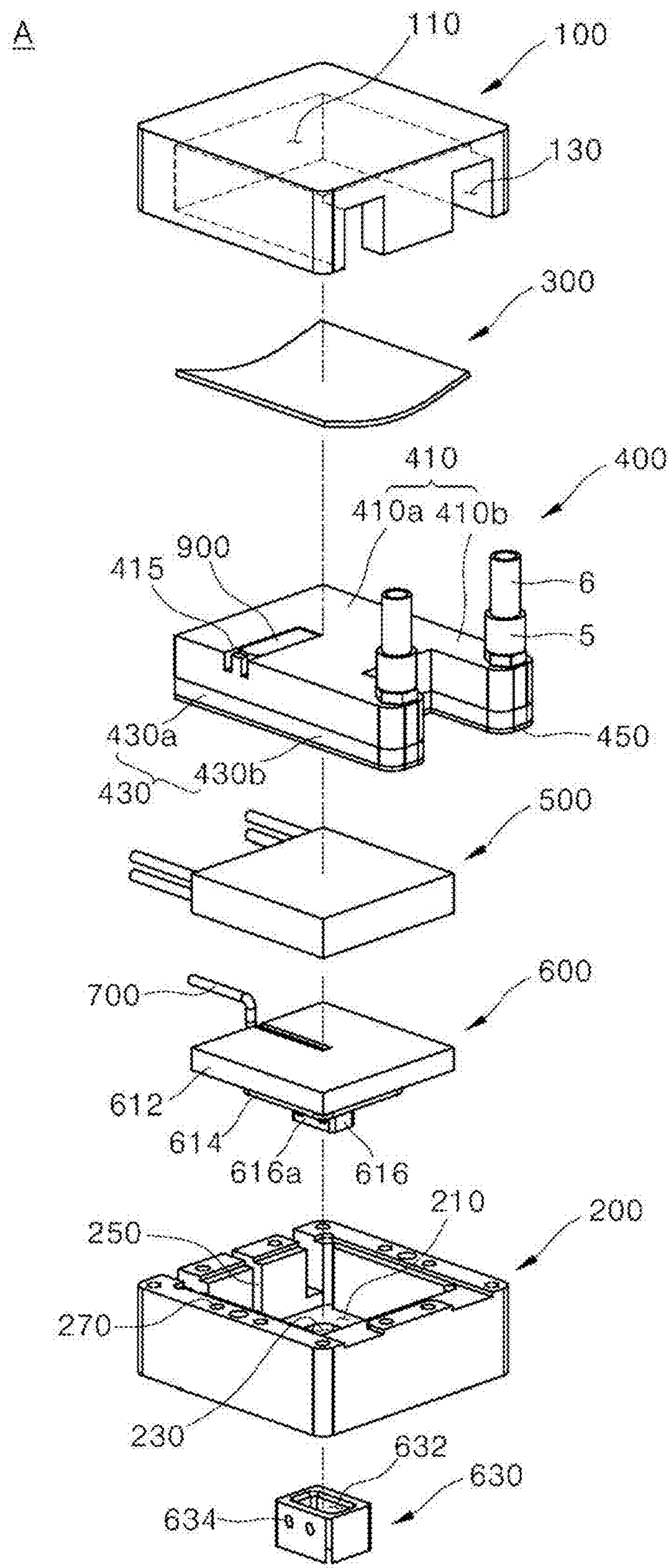
FIG. 2 is an exploded perspective view of the apparatus for testing semiconductor device shown in FIG. 1.

FIG. 2 is an exploded perspective view of the apparatus for testing semiconductor device shown in FIG. 1.

An apparatus for testing semiconductor device A according to an embodiment may be in contact with a test target device 4 (e.g., a semiconductor device) mounted on the holder 3 to apply heat to the test target device 4 or cool the test target device 4.

The test target device 4 is disposed on a tray 2 in a state of being mounted on the holder 3. A hole may extend through the holder 3 so that the test target device 4 is exposed to an outside through the hole. The tray 2 may be transferred to a position under a handler (not shown) for testing in a state of being loaded on a loading plate 1.

The handler (not shown) may be disposed on top of the tray 2 on which the test target device 4 is mounted. The handler (not shown) is lowered to test the test target device 4, and a portion of a pusher module 600 of the apparatus for testing semiconductor device A is inserted into the hole of the holder 3, so that the pusher module 600 contacts the test target device 4.

The apparatus for testing semiconductor device A according to an embodiment may include an upper housing 100 and a lower housing 200 defining an outer appearance thereof, a thermoelectric element module 500 accommodated in the upper housing and the lower housing and having each of both opposing side surfaces switched to a heating surface or a cooling surface according to a direction of current applied thereto, a cooling module 400 accommodated in the upper housing 100 and the lower housing 200 and disposed on top of the thermoelectric element module 500 to cool the thermoelectric element, the pusher module 600 disposed under the thermoelectric element module 500 and contacting the test semiconductor device.

The upper housing 100 has a box shape with an open lower surface. The lower housing 200 may be coupled to a lower side of the upper housing 100. An elastic member 300, the cooling module 400, and the thermoelectric element module 500 may be accommodated in the upper housing.

A receiving space 110 into which the cooling module 400 is inserted is defined inside the upper housing 100. In addition, an opening 130 through which a portion of the cooling module 400 is exposed to the outside is formed in one side surface of the upper housing 100.

The clastic member 300 and the cooling module 400 are accommodated in the receiving space 110. The receiving space 110 is formed to be recessed upwardly in the upper housing 100. The receiving space 110 may have a shape corresponding to a shape of the cooling module 400. The cooling module 400 may be accommodated in the receiving space 110 in a state in which the clastic member 300 has been inserted into the receiving space 110.

The opening 130 is formed in one side surface of the upper housing 100. A portion of the cooling module 400 may be exposed to the outside out of the upper housing 100 through the opening 130.

The clastic member 300 has a shape convexly protruding in one direction. For example, the elastic member 300 may be a leaf spring having a shape protruding in one direction. When the clastic member 300 is inserted into the receiving space 110, a protruding portion thereof faces the cooling module 400. The elastic member 300 serves to press the cooling module 400 such that the cooling module 400 and the thermoelectric element module 500 are in close contact with each other. To this end, the convex portion of the elastic member 300 may face the cooling module 400. When the elastic member 300 is pressed by the cooling module 400 in mounting the cooling module 400 into the receiving space 110, the convex portion may be pressed such that the elastic member 300 may be brought into a flat state. However, since the elastic member 300 has a restoring force to be restored to its original shape, the restoring force acts toward the cooling module 400. Therefore, the elastic member 300 presses the cooling module 400 toward the thermoelectric element module 500 under the restoring force. Accordingly, the cooling module 400 and the thermoelectric element module 500 may be coupled to each other in a close contact with each other.

The clastic member 300 allows the cooling module 400 and the thermoelectric element module 500 to be coupled to each other in a close contact with each other. In addition, even when the thermoelectric element module 500 or the pusher module 600 is heated and thus thermally expands and thus the thermoelectric element module 500 is pushed or moved, the elastic member 300 presses the cooling module 400 toward the thermoelectric element module 500 to maintain a close contact state between the cooling module 400 and the thermoelectric element module 500. That is, even when the thermoelectric element module 500 or the pusher module 600 thermally expands, the clastic member 300 may allow the cooling module 400 and the thermoelectric element module 500 closely contact each other. To this end, in consideration of the thermal expansion of the thermoelectric element module 500 or the pusher module 600, the elastic member 300 may be designed to have an elastic restoring force set to overcome the thermal expansion.

The lower housing 200 is coupled to a lower side of the upper housing 100 and has a hexahedral shape with an opened upper surface. An accommodation space is formed in the lower housing 200 and accommodates therein the thermoelectric element module 500 and a portion of the pusher module 600.

A receiving space 210 having a shape corresponding to a shape of a pusher base of the pusher module 600 which will be described later is defined in the lower housing 200. A through hole 230 communicates with the receiving space 210 and extends through a lower surface of the lower housing 200 such that a portion of the pusher module 600 is inserted into the through hole 230 and protrudes beyond the through hole into an outside. The through hole 230 extends through a center of the lower surface of the lower housing 200. A shape of the through hole 230 corresponds to a shape of a connector 616 of the pusher module 600, which will be described later.

An opening 250 is formed in one side surface of the lower housing 200. A temperature sensor 701 may be exposed to the outside through the opening 250.

A plurality of grooves or holes 270 facing toward the upper housing 100 may be defined in an upper end of a side wall of the lower housing 200. A fastening member may be inserted into each of the plurality of grooves or holes 270 to couple the lower housing 200 to the upper housing 100. For example, a ball plunger may be used as the fastening member.

Each of the upper housing 100 and the lower housing 200 may be made of a plastic or resin material having a high melting point. It is preferable that each of the upper housing 100 and the lower housing 200 is made of a material that is not deformed or does not melt at a temperature at which the heating surface of the thermoelectric element module 500 is heated. For example, each of the upper housing 100 and the lower housing 200 may be made of a PEEK material. In addition, each of the upper housing 100 and the lower housing 200 may be formed in an injection manner.

The thermoelectric element module 500 may include one or more Peltier elements. The thermoelectric element module 500 has both opposing sides, that is, an upper surface and a lower surface, which are switched to the heating surface or the cooling surface according to an application direction of the current.

A temperature sensor may be disposed on at least one of the pusher module 600, the thermoelectric element module 500, or the cooling module 400. For example, the temperature sensor 700 may be disposed at one side of the pusher module 600. In another example, the temperature sensor may be disposed at one side of the lower surface of the thermoelectric element module 500 or one side of an upper surface of the thermoelectric element module 500.

The cooling module 400 may be divided into a portion accommodated in the receiving space 110 of the upper housing 100 and a portion protruding toward the outside. However, the received portion and the protruding portion are not separated from each other, and a portion of the cooling module 400 may protrude to the outside out of the upper housing 100.

An upper layer 410 includes a cooling portion **410*a* having a shape corresponding to a shape of the thermoelectric element 500, and a pair of protrusions 410*b* respectively protruding from both opposing ends in a width direction of the cooling portion 410*a* with a predetermined width. The cooling portion 410*a* and the protrusions 410*b* of the upper layer 410 are integrally formed with each other. Refrigerant may be introduced into the cooling module 400 through the protrusion 410*b* at one end of the cooling portion 410*a***, and the refrigerant may be discharged through the protrusion at the other end thereof.

The lower layer 430 includes a cooling portion **430*a* and a protrusion 430*b* in the same manner as the upper layer 410. The cooling portion 430*a* is a portion that cools the thermoelectric element 500, and the protrusion 430*b* is a portion that covers the protrusions 410*b* of the upper layer 410. The protrusion 430*b* is coupled to the protrusion 410*b* of the upper layer 410 and is exposed to the outside out of the upper housing 100. The cooling portion 430*a* is located under the cooling portion 410*a* of the upper layer 410, and the protrusion 430*b* is located under the protrusion 410*b* of the upper layer 410. The refrigerant may be received in the upper layer 410 via coupling the upper layer 410 and the lower layer 430**.

A sensor receiving space 415 is formed in an upper surface of the cooling module 400. A bimetal sensor 900 is accommodated in the sensor receiving space 415. The bimetal sensor 900 is contracted or stretched based on a temperature of the upper surface of the cooling module 400. The bimetal sensor 900 is electrically connected to a power supply module. When the bimetal sensor 900 is contracted, electrical connection thereof with the power supply module may be cut off. When the bimetal sensor 900 is stretched, the bimetal sensor 900 may be electrically connected to the power supply module.

One side of the cooling module 400 is connected to a pair of flow paths 6 for introducing the refrigerant into the cooling module 400 or discharging the refrigerant in the cooling module 400 to the outside, and each coupling member 5 for coupling each flow path 6 and the cooling module 400 to each other.

The pusher module 600 may include a first plate 612 in surface contact with the thermoelectric element module 500, a second plate 614 disposed under the first plate 612, and a connector 616 disposed under the second plate 614. A size of the first plate 612 may be larger than a size of the second plate 614, and the size of the second plate 614 may be larger than a size of the connector 616. The pusher module 600 may be made of a material having a high thermal conductivity to transfer heat or cold air of the thermoelectric module 500 to the test target device 4. For example, each of the first plate 612, the second plate 614, and the connector 616 may be made of an aluminum material.

The first plate 612 contacts the thermoelectric element module 500 and supports the thermoelectric element module 500. The second plate 614 is disposed under the first plate 612 and transfers heat or cold air from the first plate 612 to the connector 616. The second plate 614 may be omitted according to an embodiment.

The connector 616 may be connected to a lower portion of the second plate 614 and may be coupled to the pusher 630. The connector 616 receives heat or cold air from the second plate 614 and transmits the received heat or cold air to the test target device 4.

Thus, the connector 616 should be in direct contact with the device under test 4. To this end, the connector 616 is exposed to the outside through an opening formed in the lower surface of the lower housing 200. In addition, the connector 616 may be coupled to the pusher 630, and the pusher 630 may be inserted into the holder 3 of the test target device 4 so as to be in contact with the test target device 4. The lower surface of the connector 616 is exposed to the outside through an opening formed in the lower surface of the pusher 630.

The pusher 630 is coupled to the connector 616 and protects the portion of the connector 616 exposed to the outside out of the lower housing 200. Therefore, the pusher 630 has a shape corresponding to the shape of the connector 616.

The pusher 630 may be inserted into the holder 3 on which the test target device 4 is mounted so as to press the holder 3. When the pusher 630 is coupled to the holder 3, a lower surface of the connector 616 exposed to the outside through the lower surface of the pusher 630 may be in contact with the test target device 4. The heat or cold air emitted from the thermoelectric element module 500 may be transferred to the test target device 4 through the connector 616.

Figure 3:
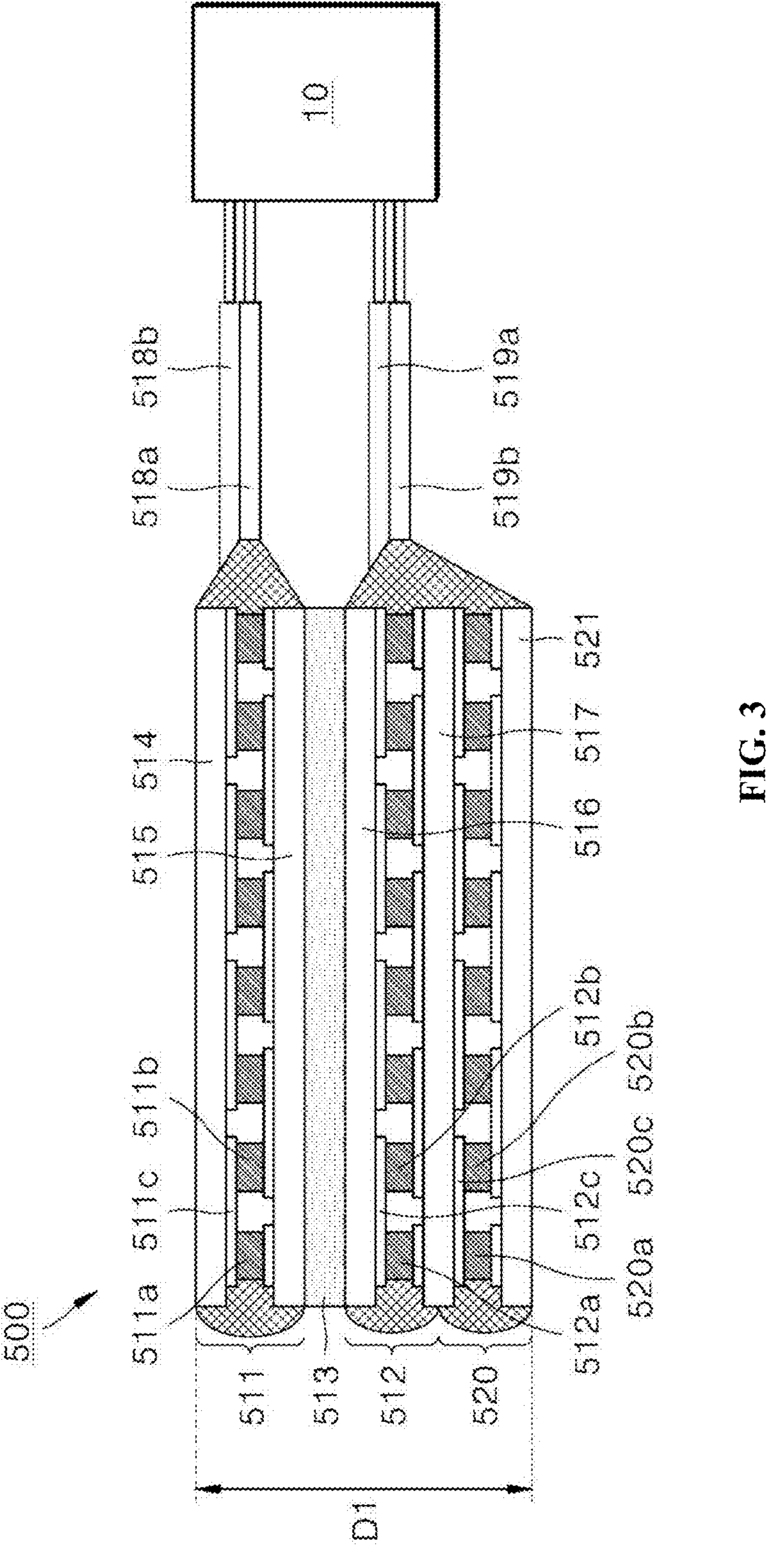
FIG. 3 is a longitudinal sectional view of a Peltier element according to a first embodiment.

FIG. 3 is a longitudinal sectional view of a Peltier element according to a first embodiment.

In the first embodiment, the thermoelectric element module 500 includes a first Peltier element 511, an adapter 513, and a second Peltier element 512 and 520.

The first Peltier element 511 includes a first upper substrate 514, a first lower substrate 515, a plurality of first semiconductor elements 511*a*, a plurality of second semiconductor elements 511*b*, and a plurality of metal plates 511*c*.

The first upper substrate 514 transfers heat or cold air in an upward direction. The first lower substrate 515 transfers heat or cold air in a downward direction. Each of the first upper substrate 514 and the first lower substrate 515 may be made of a material (for example, ceramic) having high thermal conductivity to easily transfer heat or cold air.

The plurality of first semiconductor elements 511*a* and the plurality of second semiconductor elements 511*b* are disposed between the first upper substrate 514 and the first lower substrate 515 and are alternately arranged with each other in a horizontal direction. The first semiconductor element 511*a* may be a n-type (or p-type) semiconductor, and the second semiconductor element 511*b* may be a p-type (or n-type) semiconductor.

The metal plate 511*c* is attached to an upper surface or a lower surface of each of the first semiconductor element 511*a* and the second semiconductor element 511*b*. When current is supplied to the first semiconductor element 511*a* and the second semiconductor element 511*b* via the metal plate 511*c*, a temperature of an upper surface of each of the first semiconductor element 511*a* and the second semiconductor element 511*b* increases (or decreases), while a temperature of a lower surface of each of the first semiconductor element 511*a* and the second semiconductor element 511*b* decreases (increases), under the Peltier effect.

The second Peltier element 512 and 520 is a Peltier element having a two layers structure. The second Peltier element 512 and 520 includes a second upper substrate 516, an intermediate substrate 517, a second lower substrate 521, a plurality of first semiconductor elements 512*a*, a plurality of second semiconductor elements 512*b*, a plurality of third semiconductor elements 520*a*, a plurality of fourth semiconductor elements 520*b*, and a plurality of metal plates 512*c* and 520*c*.

The second upper substrate 516 transfers heat or cold air in an upward direction. The second lower substrate 521 transfers heat or cold air in a downward direction. When the temperature of the second upper substrate 516 increases (decreases), a temperature of a lower surface of the intermediate substrate 517 drops (increases). When the temperature of the second lower substrate 521 increases (decreases), a temperature of an upper surface of the intermediate substrate 517 drops (increases). Each of the second upper substrate 516, the intermediate substrate 517, and the second lower substrate 521 may be made of a material (for example, ceramic) having high thermal conductivity to easily transfer heat or cold air.

The plurality of first semiconductor elements 512*a* and the plurality of second semiconductor elements 512*b* are disposed between the second upper substrate 516 and the intermediate substrate 517 and are alternately arranged with each other in the horizontal direction. The first semiconductor element 512*a* may be a n-type (or p-type) semiconductor, and the second semiconductor element 512*b* may be a p-type (or n-type) semiconductor.

The metal plate 512*c* is attached to an upper surface or a lower surface of each of the first semiconductor element 512*a* and the second semiconductor element 512*b*. When current is supplied to the first semiconductor element 512*a* and the second semiconductor element 512*b* via the metal plate 512*c*, a temperature of an upper surface of each of the first semiconductor element 512*a* and the second semiconductor element 512*b* increases (or decreases) while a temperature of a lower surface of each of the first semiconductor element 512*a* and the second semiconductor element 512*b* decreases (increases) under the Peltier effect.

The plurality of third semiconductor elements 520*a* and the plurality of fourth semiconductor elements 520*b* are disposed between the intermediate substrate 517 and the second lower substrate 521 and are alternately arranged with each other in the horizontal direction. The third semiconductor element 520*a* may be a n-type (or p-type) semiconductor, and the fourth semiconductor element 520*b* may be a p-type (or n-type) semiconductor.

The metal plate 520*c* is attached to an upper surface or a lower surface of each of the third semiconductor element 520*a* and the fourth semiconductor element 520*b*. When a current is supplied to the third semiconductor element 520*a* and the fourth semiconductor element 520*b* via the metal plate 520*c*, a temperature of an upper surface of each of the third semiconductor element 520*a* and the fourth semiconductor element 520*b* increases (or decreases) while a temperature of a lower surface of each of the third semiconductor element 520*a* and the fourth semiconductor element 520*b* decreases (or increases) under the Peltier effect.

The adapter 513 is disposed between the first Peltier element 511 and the second Peltier element 512 and 520. The adapter 513 transfers the heat or cold air of the lower surface of the first Peltier element 511 to the upper surface of the second Peltier element 512 and 520. The adapter 513 may be made of a material (e.g., metal) having high thermal conductivity.

A pair of conducting wires 518*a* and 518*b* are connected to the metal plate 511*c* of the first Peltier element 511. A pair of conducting wires 519*a* and 519*b* are connected to the metal plates 512*c* and 520*c* of the second Peltier element 512 and 520. The conducting wires 518*a* and 518*b* and the conducting wires 519*a* and 519*b* are connected to a control module 10.

The control module 10 may supply current to the first Peltier element 511 and the second Peltier element 512 or 520 through the conducting wires 518*a* and 518*b* and the conducting wires 519*a* and 519*b*, respectively. Although not shown, the control module 10 may include the power supply module for supplying the current to the first Peltier element 511 and the second Peltier element 512 and 520, and a control circuit for controlling a flow direction of the current to be supplied to the first Peltier element 511 and the second Peltier element 512 and 520 based on a target temperature value.

In an embodiment, the control circuit may change the direction of the current to be supplied to the first Peltier element 511 and the second Peltier element 512 and 520 by changing a polarity (+, −) of the power supply module. For example, the control circuit may supply the current flowing in a first direction to the first Peltier element 511 and the second Peltier element 512 and 520, and may supply the current flowing in a second direction to the first Peltier element 511 and the second Peltier element 512 and 520 by changing the polarity (+, −) of the power supply module to an opposite polarity thereto. For example, when the current is supplied in the first direction, the temperature of the upper surface of each of the Peltier elements 511, 512, and 520, that is, the upper surface of the second upper substrate 516 may decrease, and the temperature of the lower surface of each of the Peltier elements 511, 512, and 520, that is, the temperature of the lower surface of the second lower substrate 521 may increase. When the current is supplied in the second direction, the temperature of the upper surface of each of the Peltier elements 511, 512, and 520 may be increased, and the temperature of the lower surface of each of the Peltier elements 511, 512, and 520 may be decreased.

The control circuit may raise or lower the temperature of the connector 616 of the pusher module 600 in contact with the lower surface of the second Peltier element 512 and 520 by raising or lowering the temperature of the lower surface of the second Peltier element 512 and 520, i.e. the lower surface of the second lower substrate 521.

In an embodiment, when the temperature of the lower surface of the second Peltier element 512 or 520, that is, the lower surface of the second lower substrate 521 increases, the control circuit may control the temperature of the lower surface of the first Peltier element 511 to increase. When the temperature of the lower surface of the second Peltier element 512 and 520 is decreased, the control circuit may control the temperature of the lower surface of the first Peltier element 511 to decrease. When the temperature of the lower surface of the second Peltier element 512 and 520 increases (decreases), the temperature of the upper surface of the second Peltier element 512 and 520, that is, the upper surface of the second upper substrate 516 decreases (increases). In this case, when the temperature of the lower surface of the first Peltier element 511 is increased (decreased), the temperature of the upper surface of the second Peltier element 512 and 520 is increased (decreased).

When the temperature of the lower surface of the second Peltier element 512 and 520, that is, the lower surface of the second lower substrate 521 is increased (decreased), the temperature of the upper surface of the second Peltier element 512 and 520, that is, the upper surface of the second upper substrate 516 may be increased (decreased) such that a temperature control range (lowest temperature and maximum temperature) of the lower surface of the second Peltier element 512 and 520 is wider than an unique temperature control range of the second Peltier element 512 and 520. Thus, the test target device may be tested in a wider temperature range.

Figure 4:
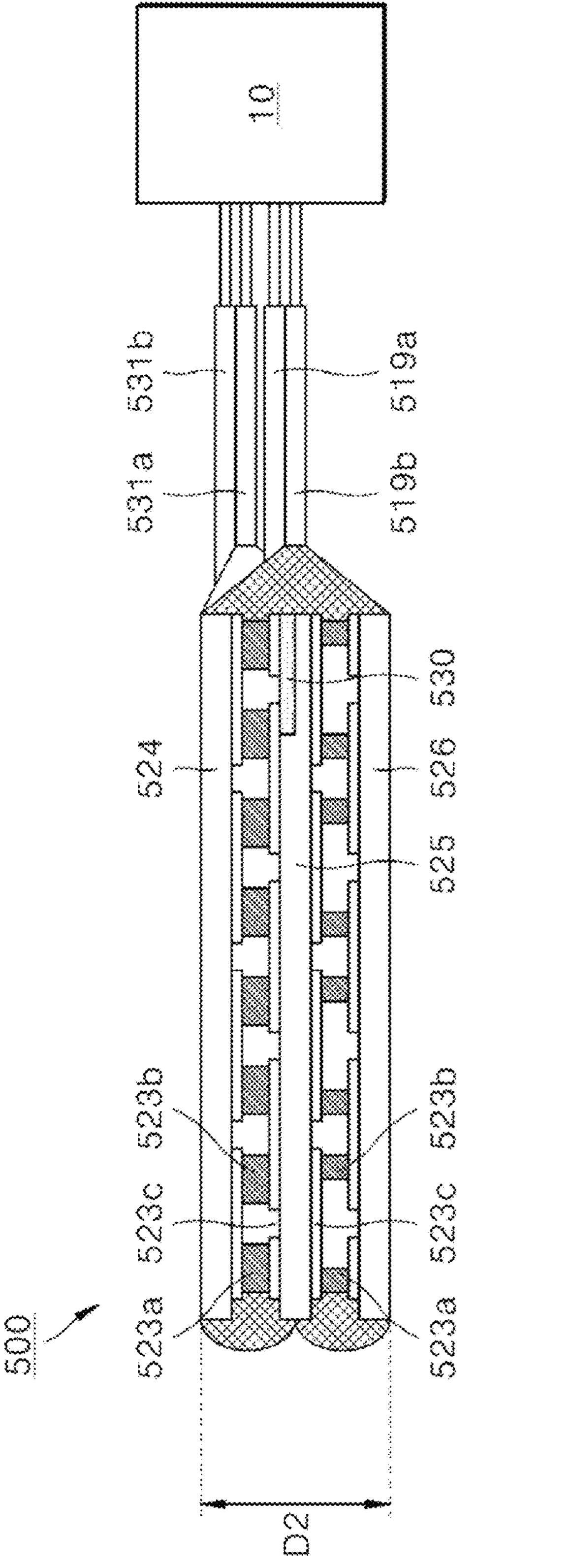
FIG. 4 is a longitudinal sectional view of a Peltier element according to a second embodiment.

FIG. 4 is a longitudinal sectional view of a Peltier element according to a second embodiment.

In the second embodiment, the thermoelectric element module 500 is a Peltier element having a two layers structure. The thermoelectric module 500 includes an upper substrate 524, an intermediate substrate 525, a lower substrate 526, a plurality of first semiconductor elements 522*a*, a plurality of second semiconductor elements 522*b*, a plurality of metal plates 522*c*, a plurality of third semiconductor elements 523*a*, a plurality of fourth semiconductor elements 523*b*, and a plurality of metal plates 523*c*.

The upper substrate 524 transfers heat or cold air in an upward direction. The lower substrate 526 transfers heat or cold air in a downward direction. When the temperature of the upper substrate 524 is increased (decreased), the temperature of the lower surface of the intermediate substrate 525 is decreased (increased). When the temperature of the lower substrate 526 is increased (decreased), the temperature of the upper surface of the intermediate substrate 525 is decreased (increased). Each of the upper substrate 524, the intermediate substrate 525, and the lower substrate 526 may be made of a material (e.g., ceramic) having high thermal conductivity so as to easily transfer heat or cold air.

The plurality of first semiconductor elements 522*a* and the plurality of second semiconductor elements 522*b* are disposed between the upper substrate 524 and the intermediate substrate 525 and are alternately arranged with each other in the horizontal direction. The first semiconductor element 522*a* may be a n-type (or p-type) semiconductor, and the second semiconductor element 522*b* may be a p-type (or n-type) semiconductor. Hereinafter, a layer including the upper substrate 524 and the intermediate substrate 525 is referred to an upper layer.

The metal plate 522*c* is attached to an upper surface or a lower surface of each of the first semiconductor element 522*a* and the second semiconductor element 522*b*. When the current is supplied to the first semiconductor element 522*a* and the second semiconductor element 522*b* through the metal plate 522*c*, the temperature of the upper surface of each of the first semiconductor element 522*a* and the second semiconductor element 522*b* increases (or decreases), while the temperature of the lower surface of each of the first semiconductor element 522*a* and the second semiconductor element 522*b* is decreased (or increased) under the Peltier effect.

In addition, the plurality of third semiconductor elements 523*a* and the plurality of fourth semiconductor elements 523*b* are disposed between the intermediate substrate 525 and the lower substrate 526 and are alternately arranged with each other in the horizontal direction. The third semiconductor element 523*a* may be a n-type (or p-type) semiconductor, and the fourth semiconductor element 523*b* may be a p-type (or n-type) semiconductor. Hereinafter, a layer including the intermediate substrate 525 and the lower substrate 526 is referred to as a lower layer.

The metal plate 523*c* is attached to an upper surface or a lower surface of each of the third semiconductor element 523*a* and the fourth semiconductor element 523*b*. When the current is supplied to the third semiconductor element 523*a* and the fourth semiconductor element 523*b* through the metal plate 523*c*, the temperature of the upper surface of each of the third semiconductor element 523*a* and the fourth semiconductor element 523*b* increases (or decreases) while the temperature of the lower surface of each of the third semiconductor element 523*a* and the fourth semiconductor element 523*b* is decreased (or increased) udder the Peltier effect.

A pair of conductive wires 528*a* and 528*b* are connected to the metal plates 522*c* and 523*c*. The control module 10 may supply current to the first semiconductor element 522*a*, the second semiconductor element 522*b*, the third semiconductor element 523*a*, and the fourth semiconductor element 523*b* through the conductive wires 528*a* and 528*b*, respectively. Although not shown, the control module 10 may include the power supply module for supplying the current to the first semiconductor element 522*a* and the second semiconductor element 522*b*, and the third semiconductor element 523*a* and the fourth semiconductor element 523*b*, and a control circuit for controlling a flow direction of current to be supplied to the first semiconductor element 522*a* and the second semiconductor element 522*b*, and the third semiconductor element 523*a* and the fourth semiconductor element 523*b* based on a target temperature value.

In the second embodiment, since the lower layer is used for temperature control for testing the electrical characteristics of the device under test, it is preferable that the lower layer has a relatively large temperature control range. In addition, since the upper layer is used to adjust the temperature of an upper portion of the lower layer, that is, the intermediate substrate 525, the upper layer may have a relatively small temperature control range. As a size of the semiconductor element disposed between the upper substrate and the lower substrate of the Peltier element decreases, the temperature control range of the lower substrate increases. Therefore, in one embodiment, a size of each of the first semiconductor element 522*a* and the second semiconductor element 522*b* may be set to be larger than a size of each of the third semiconductor element 523*a* and the fourth semiconductor element 523*b*.

A temperature sensor 530 may be disposed at one side of the intermediate substrate 525 or inside the intermediate substrate 525. A pair of conductive wires 531*a* and 531*b* are connected to the temperature sensor 530. The conducting wires 531*a* and 531*b* are connected to the control module 10. The control module 10 may obtain a temperature value of the intermediate substrate 525 measured by the temperature sensor 530 through the conductive wires 531*a* and 531*b*.

The control circuit may raise or lower the temperature of the connector 616 of the pusher module 600 in contact with the lower substrate 526 by raising or lowering the temperature of the lower substrate 526.

In an embodiment, when the temperature of the lower substrate 526 increases, the control circuit may control the temperature of the upper substrate 524 to decrease. When the temperature of the lower substrate 526 is decreased, the control circuit may control the temperature of the upper substrate 524 to increase. When the temperature of the lower substrate 526 increases (decreases), the temperature of the lower surface of the intermediate substrate 525 decreases (increases). In addition, when the temperature of the upper substrate 524 decreases (increases), the temperature of the lower surface of the intermediate substrate 525 increases (decreases).

When the temperature of the lower surface of the lower layer is increased (decreased), the temperature of the intermediate substrate 525 may be increased (decreased) using the upper layer such that the temperature control range (the lowest temperature and the highest temperature) of the lower substrate 526 is wider than an unique temperature control range of the lower layer, so that the test target device may be tested in a wider temperature range.

The thermoelectric module 500 according to the first embodiment illustrated in FIG. 3 includes five substrates 514, 515, 516, 517, and 521 and the adapter 513. However, the thermoelectric module 500 according to the second embodiment shown in FIG. 4 includes three substrates 524, 525, and 526. Therefore, a height D1 of the apparatus for testing semiconductor device including the thermoelectric module 500 according to the second embodiment is smaller than a height D2 of the apparatus for testing semiconductor device including the thermoelectric module 500 according to the first embodiment. According to the second embodiment, a larger number of apparatus for testing semiconductor devices may be disposed in a space having the same size, and thus a manufacturing speed of the semiconductor device may be improved, and a manufacturing cost thereof may be reduced.

Figure 5:
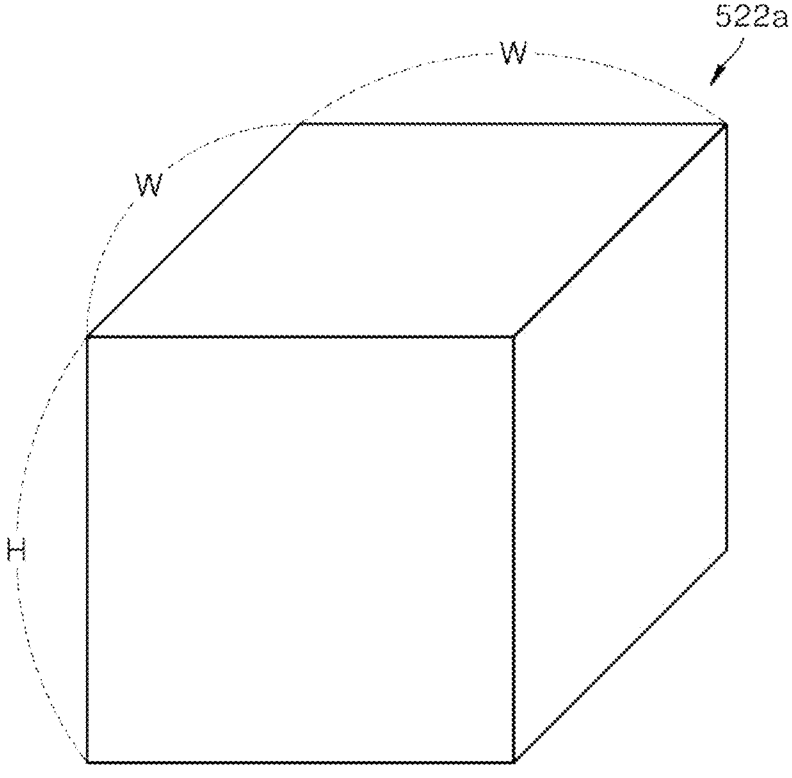
FIG. 5 is a perspective view of a semiconductor element disposed in a Peltier element according to an embodiment.
Figure 6:
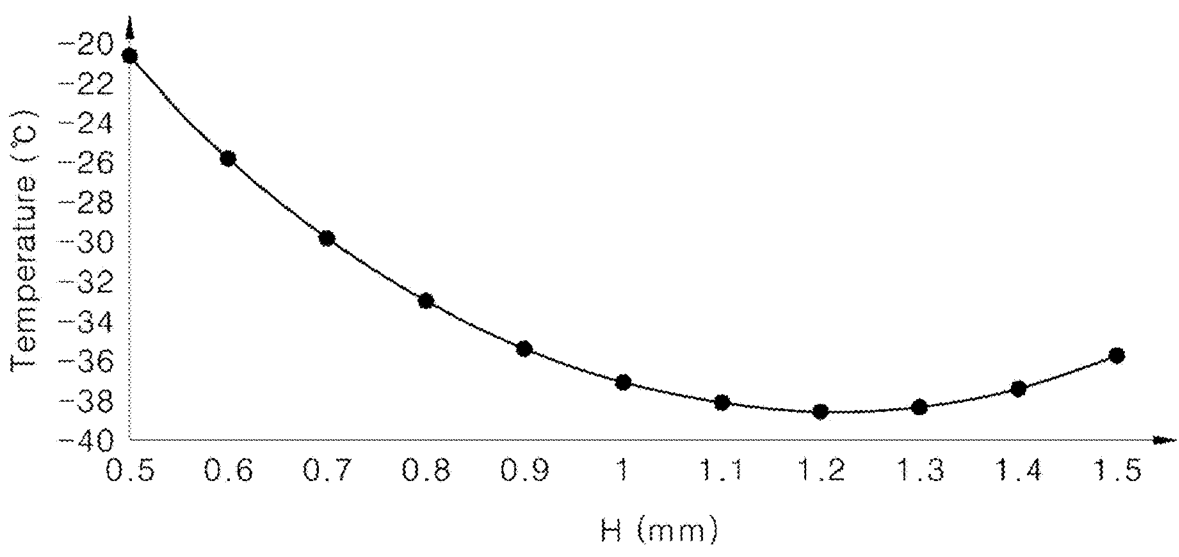
FIG. 6 is a graph illustrating a change in a cooling temperature value of a Peltier element based on a change in a height of a semiconductor element disposed in a Peltier element according to an embodiment.

FIG. 5 is a perspective view of a semiconductor element disposed in a Peltier element according to an embodiment, and FIG. 6 is a graph illustrating a change in a cooling temperature value of a Peltier element based on a change in a height of a semiconductor element disposed in a Peltier element according to an embodiment.

FIG. 5 illustrates a shape and a dimension value of the first semiconductor element 522*a* included in the thermoelectric element module 500. However, each of the semiconductor elements 522*b*, 523*a*, and 523*b* illustrated in FIG. 4 may also have a shape and a ratio of dimension values as those of the first semiconductor element 522*a* illustrated in FIG. 5.

Referring to FIG. 5, the first semiconductor element 522*a* has a hexahedral shape having a height H. In addition, each of an upper surface and a lower surface of the first semiconductor element 522*a* may have a square shape in which a length of each of four sides is W.

FIG. 6 is a graph showing a temperature change of an upper layer when a current of the same magnitude is supplied to the upper layer such that the temperature of the upper substrate 524 is controlled to be decreased under control of the control module in a state in which the length W of each of the sides of the upper surface (or the lower surface) of the first semiconductor element 522*a* shown in FIG. 5 is fixed to 1 mm while the height H of the first semiconductor element 522*a* varies from 0.5 mm to 1.5 mm. Data values of the graph as shown in FIG. 6 are shown in Table 1.

TABLE 1

| H(mm) | 0.5 | 0.6 | 0.7 | 0.8 | 0.9 | 1 | 1.1 | 1.2 | 1.3 | 1.4 | 1.5 |
|---|---|---|---|---|---|---|---|---|---|---|---|
| T(° C.) | −20.88 | −25.81 | −29.76 | −32.91 | −35.31 | −37.04 | −38.11 | −38.56 | −38.35 | −37.47 | −35.89 |

The temperature of the upper substrate 524 is controlled to be decreased (increased) under the control of the control module. In this case, as the temperature of the upper substrate 524 decreases (increases), the temperature of the upper surface of the intermediate substrate 525 may be increased (decreased). As the temperature of the upper surface of the intermediate substrate 525 increases (decreases), the temperature of the lower layer through the upper layer is advantageously adjusted.

Similarly, the temperature of the lower substrate 526 is controlled to be decreased (increased) under the control of the control module. In this case, as the temperature of the lower surface of the intermediate substrate 525 decreases (increases), the temperature of the lower substrate 526 may be increased (deceased). As the temperature of the lower substrate 526 increases (decreases), the test target device may be tested in a wider temperature range.

In the data shown in Table 1, when the temperature of the upper layer is maintained at the lowest range (−37° C. or lower), the height H of the first semiconductor element 522*a* is in a range of 1 to 1.4 mm. Therefore, it is 526 that the numerical ratio of the length W of each side of the upper surface (or the lower surface) of the first semiconductor element 522*a* or each of the other semiconductor elements 522*b*, 523*a*, and 523*b* illustrated in FIG. 4 and the height H thereof is set to be within a range of 1:1 to 1:1.4.

When the numerical ratio of the length W of each side of the upper surface (or the lower surface) of each of the semiconductor elements 522*b*, 523*a*, and 523*b* included in the thermoelectric element module 500 having the structure illustrated in FIG. 4 and the height H thereof is set to be within a range of 1:1 to 1:1.4, the temperature control range of the lower surface of the thermoelectric element module 500 may be wider. Accordingly, it is identified that although the thermoelectric element module 500 having the structure as shown in FIG. 4 does not include one Peltier element 511 and one adapter 513, compared to the thermoelectric element module 500 having the structure as shown in FIG. 3, the temperature control range of the lower surface of the thermoelectric element module 500 having the structure as shown in FIG. 4 is equal to or wider than the temperature control range of the lower surface of the thermoelectric element module 500 having the structure as shown in FIG. 3.

In addition, since the thermoelectric element module 500 having the structure as shown in FIG. 4 does not include one Peltier element 511, compared to the thermoelectric element module 500 having the structure as shown in FIG. 3, the power consumption of the thermoelectric element module 500 having the structure as shown in FIG. 4 is lower than the power consumption of the thermoelectric element module 500 having the structure as shown in FIG. 3.

Figure 7:
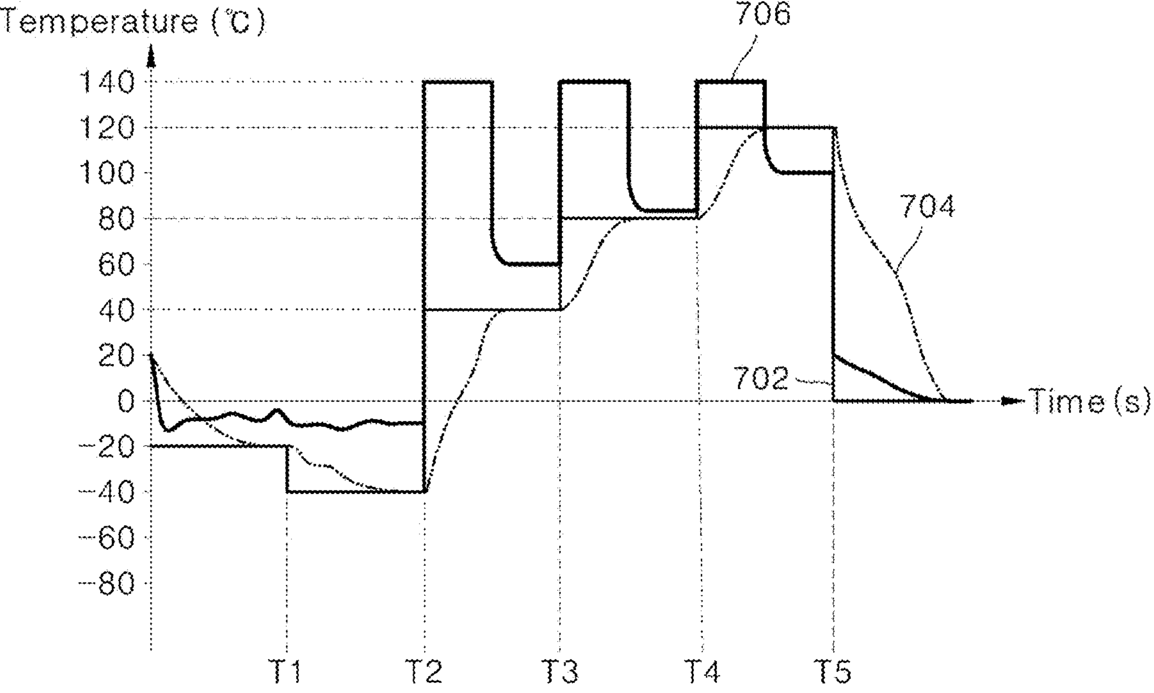
FIG. 7 is a graph illustrating a change in a connector temperature value and an intermediate substrate temperature value under temperature control of an apparatus for testing semiconductor device including a Peltier element according to an embodiment.

FIG. 7 is a graph illustrating a change in a connector temperature value and an intermediate substrate temperature value under temperature control of an apparatus for testing semiconductor device including a Peltier element according to an embodiment.

In an embodiment, the control module 10 controls the operation of the thermoelectric element module 500 based on the target temperature value. In this regard, the target temperature value refers to a temperature value of the connector 616 to be changed by the control module 10. FIG. 7 illustrates data 702 of the target temperature value.

In an embodiment, the control module 10 may obtain the temperature value of the connector 616 through the temperature sensor 700 disposed at one side of the pusher module 600. However, in another embodiment, the control module 10 may use a temperature value obtained through a temperature sensor disposed on a lower surface of the thermoelectric element module 500 or disposed at one side of the connector 616 or the pusher 630 as a temperature value of the connector 616. In FIG. 7, data 704 of the temperature value of connector 616 is shown.

In an embodiment, the control module 10 may obtain the temperature value of the intermediate substrate 525 through the temperature sensor 530 disposed at one side of the intermediate substrate 525 or inside the intermediate substrate 525. FIG. 7 shows data 706 of the temperature value of the intermediate substrate 525.

Referring to FIG. 7, at a time zero, the control module 10 sets the target temperature value 702 of the connector 616 to −20° C., and supplies the current to the thermoelectric element module 500 such that the temperature of the lower substrate 526 is decreased. Accordingly, the temperature value 704 of the connector 616 decreases to −20° C. for a period of 0 to T1.

In addition, at the time T1, the control module 10 sets the target temperature value 702 of the connector 616 to −40° C., and supplies the current to the thermoelectric element module 500 so that the temperature of the lower substrate 526 is decreased. Accordingly, the temperature value 704 of the connector 616 decreases to −40° C. for a period of T1 to T2.

For a period of 0 to T2 for which the temperature of the lower substrate 526 is controlled to decrease, the temperature value of the intermediate substrate 525 is maintained at a value between 0° C. and −20° C.

At the time T2, the control module 10 sets the target temperature value 702 of the connector 616 to 40° C., and supplies the current to the thermoelectric element module 500 such that the temperature of the lower substrate 526 increases. Accordingly, the temperature value 704 of the connector 616 is increased to 40° C. for a period of T2 to T3.

However, when the control module 10 supplies the current to the thermoelectric element module 500 such that the temperature of the lower substrate 526 increases at the point in time T2, the temperature value of the intermediate substrate 525 rapidly increases, and thus, the temperature value of the intermediate substrate 525 exceeds a predetermined limit temperature value (e.g., 120° C.). For example, the temperature value of the intermediate substrate 525 is maintained at 140° C. for a predetermined time duration and then gradually decreases to about 60° C.

The limit temperature value is a temperature value at which the intermediate substrate 525 may be damaged or destroyed. The limit temperature value may be set to vary based on material characteristics of the intermediate substrate 525.

In addition, at the time point T3, the control module 10 sets the target temperature value 702 of the connector 616 to 80° C., and supplies the current to the thermoelectric element module 500 so that the temperature of the lower substrate 526 increases. Accordingly, the temperature value 704 of the connector 616 increases to 80° C. for a period from T3 to T4.

However, when the control module 10 supplies the current to the thermoelectric element module 500 such that the temperature of the lower substrate 526 increases at the time point T3, the temperature value of the intermediate substrate 525 rapidly increases, and thus a phenomenon in which the temperature value of the intermediate substrate 525 exceeds a predetermined limit temperature value (e.g., 120° C.) occurs. For example, the temperature value of the intermediate substrate 525 is maintained at 140° C. for a predetermined time duration and then gradually decreases to about 80° C.

In addition, at the time point T4, the control module 10 sets the target temperature value 702 of the connector 616 to 120° C., and supplies the current to the thermoelectric element module 500 so that the temperature of the lower substrate 526 increases. Accordingly, the temperature value 704 of the connector 616 is increased to 120° C. for a period from T4 to T5.

However, when the control module 10 supplies the current to the thermoelectric element module 500 such that the temperature of the lower substrate 526 increases at the time point T4, a temperature value of the intermediate substrate 525 is rapidly increased, and thus a phenomenon in which the temperature value of the intermediate substrate 525 exceeds a predetermined limit temperature value (e.g., 120° C.) occurs. For example, the temperature value of the intermediate substrate 525 is maintained at 140° C. for a predetermined period of time and then gradually decreases to about 100° C.

At the time T5, the control module 10 sets the target temperature value 702 of the connector 616 to 0° C. and supplies the current to the thermoelectric element module 500 so that the temperature of the lower substrate 526 is decreased. Accordingly, after the time T5, the temperature value 704 of the connector 616 is decreased to 0° C. In addition, after the time T5, the temperature value of the intermediate substrate 525 is also lowered to 0° C.

As shown in FIG. 7, at the time points T2, T3, and T4 at which the control module 10 supplies the current to the thermoelectric element module 500 so that the temperature of the lower substrate 526 is increased, the temperature value of the intermediate substrate 525 is sharply increased, such that the temperature of the lower substrate 526 begins to increase, thereby causing a phenomenon in which the temperature value of the intermediate substrate 525 exceeds the predetermined limit temperature value. The phenomenon that the temperature value of the intermediate substrate 525 is rapidly increased, and, thus, the temperature value of the intermediate substrate 525 exceeds the predetermined limit temperature value repeatedly occurs, such that there is a high possibility that the intermediate substrate 525 or other components or elements in contact with the intermediate substrate 525 are damaged due to a high temperature.

Figure 8:
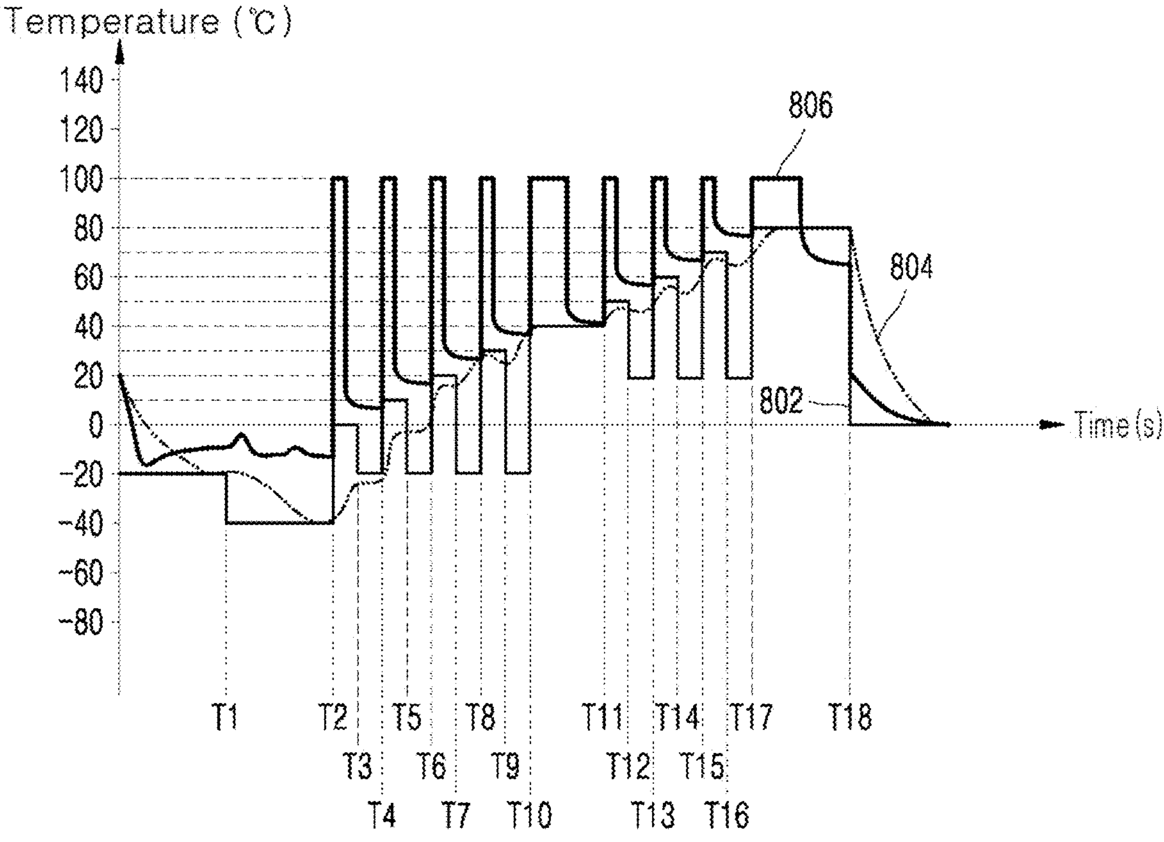
FIG. 8 is a graph illustrating a change in a connector temperature value and an intermediate substrate temperature value under temperature control of an apparatus for testing semiconductor device including a Peltier element according to another embodiment.

FIG. 8 is a graph illustrating a change in a connector temperature value and an intermediate substrate temperature value under temperature control of an apparatus for testing semiconductor device including a Peltier element according to another embodiment. FIG. 8 shows each of data 802 of the target temperature value, data 804 of the temperature value of the connector 616, and data 806 of the temperature value of the intermediate substrate 525.

Referring to FIG. 8, at a time zero, the control module 10 sets the target temperature value 802 of the connector 616 to −20° C. and supplies the current to the thermoelectric element module 500 such that the temperature of the lower substrate 526 is decreased. Accordingly, the temperature value 804 of the connector 616 decreases to −20° C. for a period of T0 to T1.

In addition, at the time T1, the control module 10 sets the target temperature value 802 of the connector 616 to −40° C., and supplies the current to the thermoelectric element module 500 so that the temperature of the lower substrate 526 is decreased. Accordingly, the temperature value 804 of the connector 616 decreases to −40° C. for a period of T1 to T2.

For a period of T0 to T2 for which the temperature of the lower substrate 526 is controlled to decrease, the temperature value of the intermediate substrate 525 is maintained at a value between 0° C. and −20° C.

The control module 10 sets a final target temperature value of the connector 616 to 40° C. for a time period from T2 to T10.

At the time T2, the control module 10 sets an intermediate rising target temperature value 702 of the connector 616 to 0° C. and supplies the current to the thermoelectric element module 500 to increase the temperature of the lower substrate 526. Accordingly, the temperature value 804 of the connector 616 is increased for a period from T2 to T3.

The control module 10 determines whether the temperature value of the intermediate substrate 525 exceeds a predetermined reference temperature value (e.g., 80° C.) for the period from T2 to T3. The reference temperature value is a value that may be set to vary according to an embodiment. In addition, the reference temperature value may be set to be lower than the limit temperature value of the intermediate substrate 525.

When it is determined that the temperature value of the intermediate substrate 525 exceeds the predetermined reference temperature value (e.g., 80° C.), the control module 10 sets an intermediate falling target temperature value 802 to −20° C. and supplies the current to the thermoelectric element module 500 so that the temperature of the lower substrate 526 is decreased at the time T3. Accordingly, an increase rate of the temperature value 704 of the connector 616 decreases for a period from T3 to T4.

At a time T4 at which a predetermined time has elapsed from the time T3, the control module 10 sets the intermediate rising target temperature value 802 of the connector 616 to 10° C. and supplies the current to the thermoelectric element module 500 to increase the temperature of the lower substrate 526. Accordingly, the temperature value 704 of the connector 616 is increased for a period from T4 to T5.

The control module 10 determines whether the temperature value of the intermediate substrate 525 exceeds the predetermined reference temperature value (e.g., 80° C.) for the period from T4 to T5.

When it is determined that the temperature value of the intermediate substrate 525 exceeds the predetermined reference temperature value (e.g., 80° C.), the control module 10 sets the intermediate falling target temperature value 802 to −20° C. and supplies the current to the thermoelectric element module 500 so that the temperature of the lower substrate 526 is decreased at the time T5. Accordingly, an increases rate of the temperature value 804 of the connector 616 decreases for a time period from T5 to T6.

At the time T6 at which a predetermined time has elapsed from the time T5, the control module 10 sets the intermediate rising target temperature value 802 of the connector 616 to 20° C. and supplies the current to the thermoelectric element module 500 to increase the temperature of the lower substrate 526. Accordingly, the temperature value 704 of the connector 616 is increased for a period from T6 to T7.

The control module 10 determines whether the temperature value of the intermediate substrate 525 exceeds the predetermined reference temperature value (e.g., 80° C.) for the period from T6 to T7.

When it is determined that the temperature value of the intermediate substrate 525 exceeds the predetermined reference temperature value (e.g., 80° C.), the control module 10 sets the intermediate falling target temperature value 802 to −20° C. and supplies the current to the thermoelectric element module 500 so that the temperature of the lower substrate 526 is decreased at the time T7. Accordingly, the increase rate of the temperature value 804 of the connector 616 is reduced for a period from T7 to T8.

At a time T8 when a predetermined time has elapsed from the time T7, the control module 10 sets the intermediate rising target temperature value 802 of the connector 616 to 30° C. and supplies the current to the thermoelectric element module 500 to increase the temperature of the lower substrate 526. Accordingly, the temperature value 804 of the connector 616 is increased for a period from T8 to T9.

The control module 10 determines whether the temperature value of the intermediate substrate 525 exceeds the predetermined reference temperature value (e.g., 80° C.) for the period from T8 to T9.

When it is determined that the temperature value of the intermediate substrate 525 exceeds the predetermined reference temperature value (e.g., 80° C.), the control module 10 sets the intermediate falling target temperature value 802 to −20° C. and supplies the current to the thermoelectric element module 500 so that the temperature of the lower substrate 526 is decreased at the time point T9. Accordingly, the increase rate of the temperature value 804 of the connector 616 decreases for a time period T9 to T10.

At the time T10 at which a predetermined time elapses from the time point T9, the control module 10 sets the intermediate rising target temperature value 802 of the connector 616 to 40° C. as the final target temperature value and supplies the current to the thermoelectric element module 500 such that the temperature of the lower substrate 526 increases. Accordingly, the temperature value of the connector 616 is maintained at 40° C. as the final target temperature value for a period for T10 to T11.

In the same manner, for a period of T11 to T17, the control module 10 may set the final target temperature value of the connector 616 to 80° C. and may supply the current to the thermoelectric element module 500 such that the temperature of the lower substrate 526 increases to each of a plurality of intermediate rising target temperature values (e.g., 50° C., 60° C., 70° C., 80° C.) set to gradually increase by a predetermined temperature increment (e.g., 10° C.) at each of the time points T11, T13, T15, and T17. In addition, when it is identified that the temperature value of the intermediate substrate 525 exceeds the predetermined reference temperature value (e.g., 80° C.), the control module 10 may supply the current to the thermoelectric element module 500 such that the temperature of the lower substrate 526 is decreased to the intermediate falling target temperature value (e.g., 20° C.) preset at each of the time points T12, T14, and T16.

In one embodiment, the increment (e.g., 10° C.) by which the intermediate rising target temperature value rises may be set to vary depending on an embodiment.

In addition, the intermediate falling target temperature values set at various time points need not be set to be equal to each other. In another example, the intermediate falling target temperature value set at various time points may be set to be different from each other.

As described above, when the temperature of the lower substrate 526 is increased to a preset final target temperature value, the control module 10 adjusts the temperature of the lower substrate 526 based on the preset intermediate rising target temperature value and the preset intermediate falling target temperature value. According to this control, when the control module 10 supplies the current to the thermoelectric element module 500 so that the temperature of the lower substrate 526 increases, the phenomenon in which the temperature value of the intermediate substrate 525 is rapidly increased such that the temperature value exceeds the limit temperature value may be prevented. Therefore, the possibility at which the intermediate substrate 525 or other components or elements in contact with the intermediate substrate 525 are damaged due to a high temperature is decreased, thereby increasing the reliability of the apparatus for testing semiconductor device.

Figure 9:
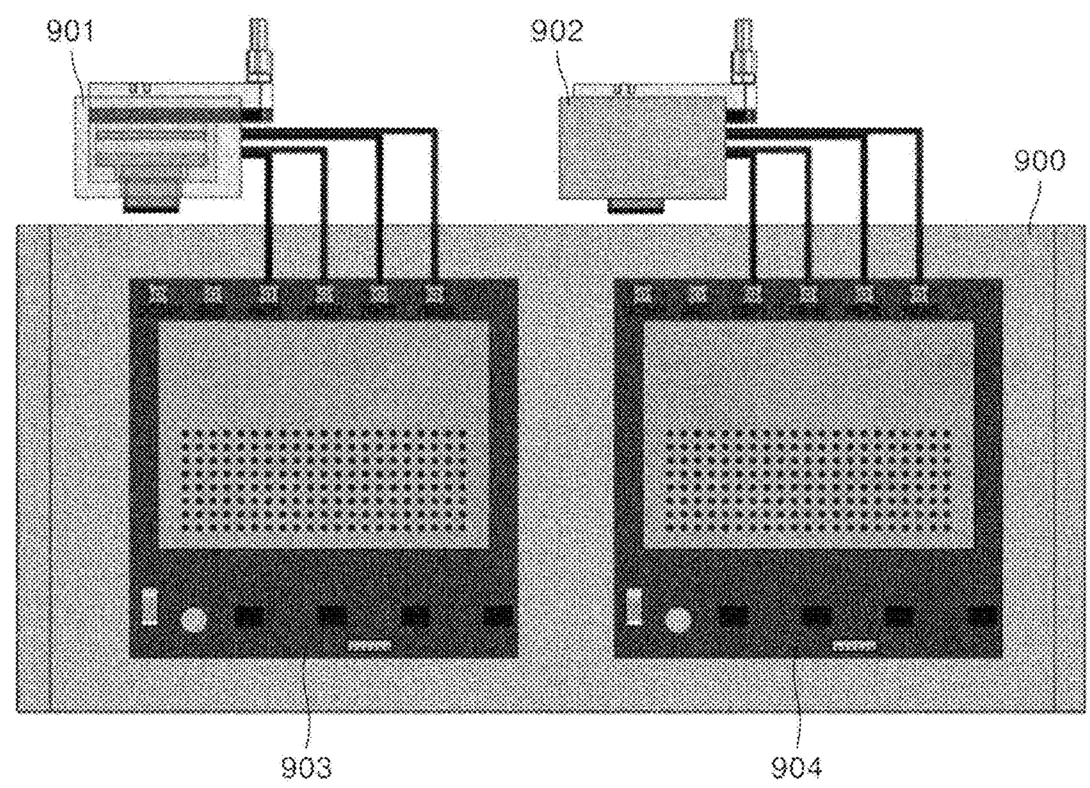
FIG. 9 illustrates a configuration of a semiconductor test system including an apparatus for testing semiconductor device to which the Peltier element according to the first embodiment is applied.
Figure 10:
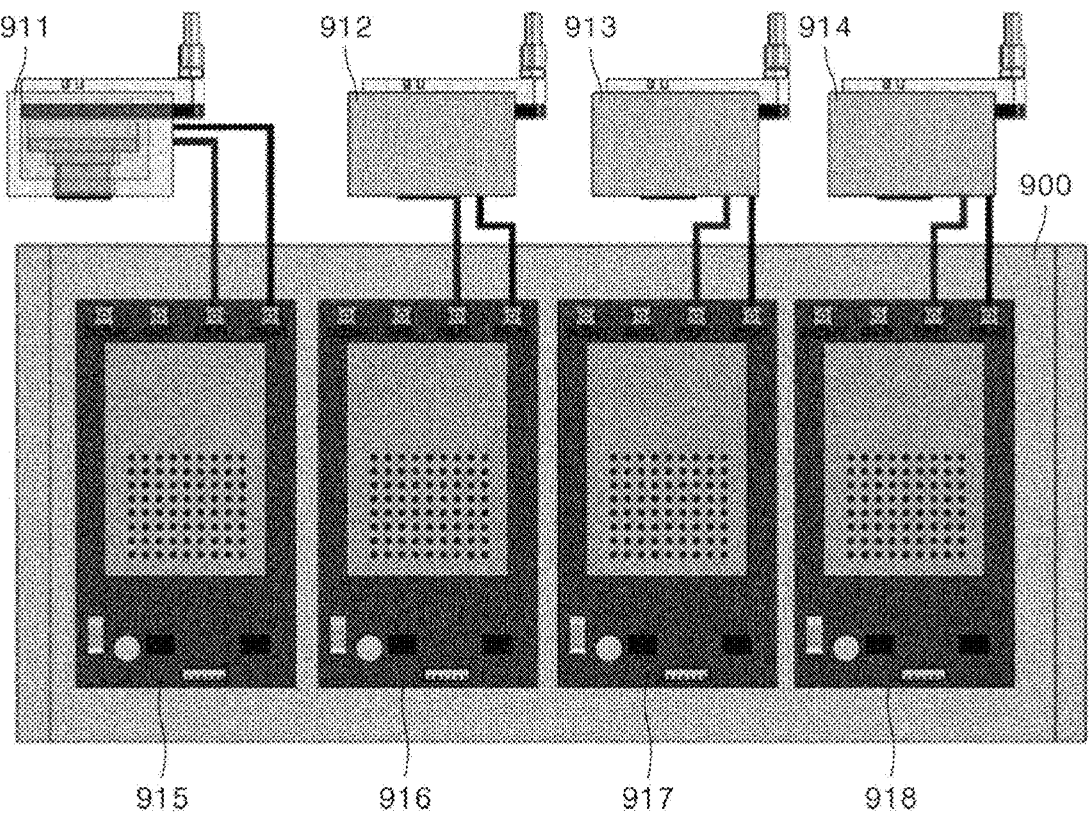
FIG. 10 illustrates a configuration of a semiconductor test system including an apparatus for testing semiconductor device to which the Peltier element according to the second embodiment is applied.

FIG. 9 illustrates a configuration of a semiconductor test system including an apparatus for testing semiconductor device to which the Peltier element according to the first embodiment is applied, and FIG. 10 illustrates a configuration of a semiconductor test system including the apparatus for testing semiconductor device to which the Peltier element according to the second embodiment is applied.

FIG. 9 illustrates apparatus for testing semiconductor devices 901 and 902, each including the thermoelectric module 500 according to the first embodiment shown in FIG. 3, control modules 903 and 904 respectively connected to the apparatus for testing semiconductor devices 901 and 902, and a casing 900 accommodating therein the control modules 903 and 904. FIG. 10 illustrates apparatus for testing semiconductor devices 911, 912, 913, and 914, each including the thermoelectric module 500 according to the second embodiment illustrated in FIG. 4, control modules 915, 916, 917, and 918 respectively connected to the apparatus for testing semiconductor devices 911, 912, 913, and 914, and the casing 900 accommodating therein the control modules 915, 916, 917, and 918. The casing 900 illustrated in FIG. 9 and the casing 900 illustrated in FIG. 10 have the same volume and size.

As shown in FIG. 9, the thermoelectric module 500 according to the first embodiment includes two Peltier elements, and thus requires two pairs of conducting wires respectively connected to the Peltier elements. Accordingly, the control modules 903 and 904 should be connected to the two pairs of conducting wires, respectively.

However, as shown in FIG. 10, the thermoelectric module 500 according to the second embodiment includes one Peltier element and requires a pair of conducting wires connected to the Peltier element. Therefore, a size of each of the control modules 915, 916, 917, and 918 shown in FIG. 10 is smaller than a size of each of the control modules 903 and 904 shown in FIG. 9.

Therefore, as shown in FIG. 10, when the thermoelectric module 500 according to the second embodiment is applied, a larger number of control modules may be accommodated in the casing 900 having the same size and volume, as compared with the first embodiment. Therefore, a larger number of apparatus for testing semiconductor devices may be disposed in the same space, such that a manufacturing speed of the semiconductor device may be improved, and a manufacturing cost thereof may be reduced.

Although the present disclosure has been described with reference to the accompanying drawings as described above, the present disclosure is not limited to the embodiments disclosed in the present disclosure and the drawings, and various modifications may be made thereto by a person skilled in the art. In addition, although an effect according to a configuration of the present disclosure is not explicitly described in describing the embodiments of the present disclosure above, a predictable effect from the configuration should also be recognized.

What is claimed is:

1. An apparatus for testing semiconductor device comprising:

a thermoelectric element module having both opposing surfaces switched to a heating surface or a cooling surface according to a flow direction of current flowing in the thermoelectric element module;

a cooling module disposed on top of the thermoelectric element module and configured to cool the thermoelectric element;

a pusher module disposed under the thermoelectric element module and contacting a test target device mounted on a holder to heat or cool the test target device; and a control module configured to control the flow direction of the current to be supplied to the thermoelectric element module based on a target temperature value, wherein the thermoelectric element module includes:

an upper substrate in contact with the cooling module;

a lower substrate in contact with the pusher module;

an intermediate substrate disposed between the upper substrate and the lower substrate;

a plurality of first semiconductor elements and a plurality of second semiconductor elements disposed between the upper substrate and the intermediate substrate; and a plurality of third semiconductor elements and a plurality of fourth semiconductor elements disposed between the intermediate substrate and the lower substrate, wherein a temperature sensor is disposed at one side of the intermediate substrate or inside the intermediate substrate, wherein the control module is configured to control the flow direction of the current to be supplied to the thermoelectric element module, based on a temperature value of the intermediate substrate measured by the temperature sensor.

2. The apparatus for testing semiconductor device of claim 1, wherein the control module is configured to:

in increasing a temperature of the lower substrate to a preset final target temperature value, control the flow direction of the current to be supplied to the thermoelectric element module, based on a temperature value of the intermediate substrate, a preset intermediate rising target temperature value, and a preset intermediate falling target temperature value.

3. The apparatus for testing semiconductor device of claim 2, wherein the control module is configured to:

when the temperature value of the intermediate substrate exceeds a predetermined reference temperature value in increasing the temperature of the lower substrate according to the intermediate rising target temperature value, control the flow direction of the current to be supplied to the thermoelectric element module such that the temperature of the lower substrate is decreased based on the intermediate falling target temperature value.

4. The apparatus for testing semiconductor device of claim 2, wherein the intermediate rising target temperature value includes a plurality of values set to gradually increase by a predetermined increment.

5. The apparatus for testing semiconductor device of claim 3, wherein the reference temperature value is set to be lower than a limit temperature value of the intermediate substrate.

6. The apparatus for testing semiconductor device of claim 1, wherein each of the first semiconductor element, the second semiconductor element, the third semiconductor element, and the fourth semiconductor element has a hexahedral shape, and has an upper surface and a lower surface having a square shape.

7. The apparatus for testing semiconductor device of claim 6, wherein a numerical ratio (W:H) of a length W of each of four sides of the upper surface or the lower surface of each of the first semiconductor element, the second semiconductor element, the third semiconductor element, the fourth semiconductor element and a height H of each of the first semiconductor element, the second semiconductor element, the third semiconductor element, and the fourth semiconductor element is set to be within a range of 1:1 to 1:1.4.

* * * * *